(12) United States Patent
Cao et al.

(10) Patent No.: US 10,051,394 B2
(45) Date of Patent: Aug. 14, 2018

(54) LOUDSPEAKER DIAPHRAGM STATE ESTIMATION METHOD AND LOUDSPEAKER DRIVING CIRCUIT USING THE SAME

(71) Applicant: Silergy Semiconductor Technology (Hangzhou) LTD, Hangzhou, ZheJiang Province (CN)

(72) Inventors: Hejinsheng Cao, Hangzhou (CN); Xiaotian Su, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 15/800,406

(22) Filed: Nov. 1, 2017

(65) Prior Publication Data
US 2018/0139552 A1 May 17, 2018

(30) Foreign Application Priority Data

Nov. 17, 2016 (CN) .......................... 2016 1 1033206

(51) Int. Cl.
*H04R 29/00* (2006.01)
*H04R 3/00* (2006.01)
*G01R 19/25* (2006.01)
*G01B 7/16* (2006.01)

(52) U.S. Cl.
CPC ............. *H04R 29/001* (2013.01); *G01B 7/18* (2013.01); *G01R 19/2506* (2013.01)

(58) Field of Classification Search
CPC ...... H04R 29/00; H04R 29/001; H04R 19/02; H04S 7/30; G01R 19/2506; G01B 7/18
See application file for complete search history.

(56) References Cited

U.S. PATENT DOCUMENTS

| 5,588,065 | A | * | 12/1996 | Tanaka | H04R 1/2842 |
| | | | | | 381/59 |
| 7,005,865 | B2 | * | 2/2006 | Yakabe | G01R 27/26 |
| | | | | | 324/686 |
| 8,401,207 | B2 | * | 3/2013 | Stanley | H03F 1/32 |
| | | | | | 333/102 |
| 8,525,529 | B2 | | 9/2013 | Ishizeki et al. | |
| 9,716,954 | B2 | | 7/2017 | Cao | |
| 9,813,812 | B2 | * | 11/2017 | Berthelsen | H04R 3/007 |

(Continued)

*Primary Examiner* — Thang Tran
(74) *Attorney, Agent, or Firm* — Michael C. Stephens, Jr.

(57) ABSTRACT

A loudspeaker diaphragm state estimation method includes: adjusting a weight value of a diaphragm displacement model by adaptive filtering until an error between an estimated value of a driving voltage of a loudspeaker and a measured value of the driving voltage is less than a predetermined threshold; estimating a diaphragm relative displacement of the loudspeaker according to the diaphragm displacement model corresponding to a final determined weight value; determining a diaphragm relative speed at a next moment based on an input current, a product value of a vector determined by an estimated value of a diaphragm relative speed and an estimated value of a diaphragm relative displacement, and a weight value vector obtained at a present moment; and determining an estimated value of the driving voltage using the estimated value of the diaphragm relative speed, the input current, and a DC impedance of the loudspeaker at the present moment.

8 Claims, 4 Drawing Sheets

(56) References Cited

U.S. PATENT DOCUMENTS

| | | | |
|---|---|---|---|
| 2001/0003541 A1* | 6/2001 | Koyano | H04R 3/002 381/111 |
| 2004/0086140 A1* | 5/2004 | Fedigan | H04R 3/00 381/96 |
| 2014/0064502 A1* | 3/2014 | Hoang Co Thuy | H04R 3/04 381/59 |
| 2014/0126730 A1* | 5/2014 | Crawley | H04R 29/001 381/59 |
| 2015/0189427 A1* | 7/2015 | Tsai | H04R 3/007 381/190 |
| 2015/0208189 A1* | 7/2015 | Tsai | H04R 29/001 381/59 |
| 2016/0286301 A1* | 9/2016 | Agerkvist | H04R 9/025 |
| 2017/0272857 A1* | 9/2017 | Ting | H04R 29/001 |

* cited by examiner

LOUDSPEAKER DIAPHRAGM STATE ESTIMATION METHOD AND LOUDSPEAKER DRIVING CIRCUIT USING THE SAME

RELATED APPLICATIONS

This application claims the benefit of Chinese Patent Application No. 201611033206.X, filed on Nov. 17, 2016, which is incorporated herein by reference in its entirety.

FIELD OF THE INVENTION

The present disclosure generally relates to the field of acoustics, and more particularly to loudspeaker diaphragm state estimation methods and loudspeaker driving circuitry.

BACKGROUND

Loudspeakers can produce sound by driving diaphragms to vibrate through an electromagnetic field that is generated by an electromagnetic coil. The rated power of a loudspeaker may be limited by its maximum diaphragm offset value. If the diaphragm offset value exceeds its maximum safety offset value, this can cause irreversible damage to the loudspeaker. In some cases, the output power of the loudspeaker can be made to be greater than the rated power, and the diaphragm offset may be made to be less than the maximum safety offset value. In this way, utilization of the loudspeaker can be improved due to the sound possibly being louder than with the rated power of the loudspeaker.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

In some portable devices, the requirement on the size of the loudspeaker may be relatively high, and the rated power of the loudspeaker can be limited. Thus, the maximum sound pressure may also be limited. In particular embodiments, the loudspeaker diaphragm can operate within a safety operation range, while also increasing its output power and sound pressure, as compared to conventional approaches. Along these lines, the diaphragm displacement of the loudspeaker can be accurately estimated (e.g., by detecting the displacement with laser, detecting the speed with a laser, detecting the sound pressure, etc.). However, sensors may be required in one or more of these approaches, and as a result the loudspeaker may be bulky, difficult to install, difficult to implement, and relatively costly, to name a few possible concerns. As such, such approaches may not be suitable for practical products.

In one embodiment, a loudspeaker diaphragm state estimation method can include: (i) adjusting a weight value of a diaphragm displacement model by adaptive filtering until an error between an estimated value of a driving voltage of a loudspeaker and a measured value of the driving voltage is less than a predetermined threshold; (ii) estimating a diaphragm relative displacement of the loudspeaker according to the diaphragm displacement model that corresponds to a final determined weight value; (iii) determining a diaphragm relative speed at a next moment based on an input current, a product value of a vector determined by an estimated value of a diaphragm relative speed and an estimated value of a diaphragm relative displacement, and a weight value vector obtained at a present moment; and (iv) determining an estimated value of the driving voltage based on the estimated value of the diaphragm relative speed, the input current, and a DC impedance of the loudspeaker obtained at the present moment.

Figure 1:
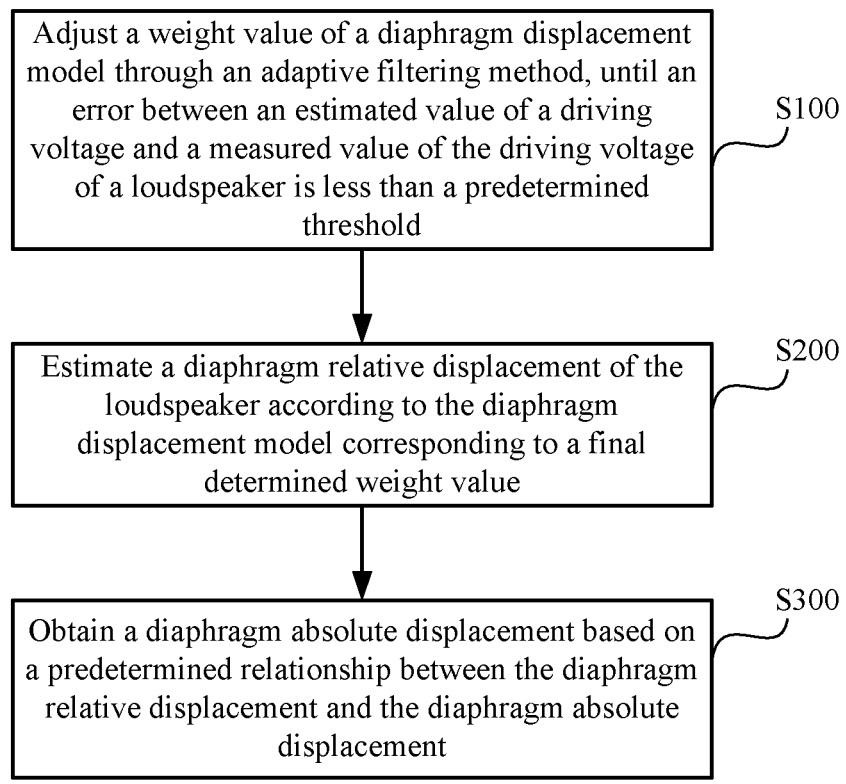
FIG. 1 is a flow diagram of an example loudspeaker diaphragm state estimation method, in accordance with embodiments of the present invention.
Figure 2:
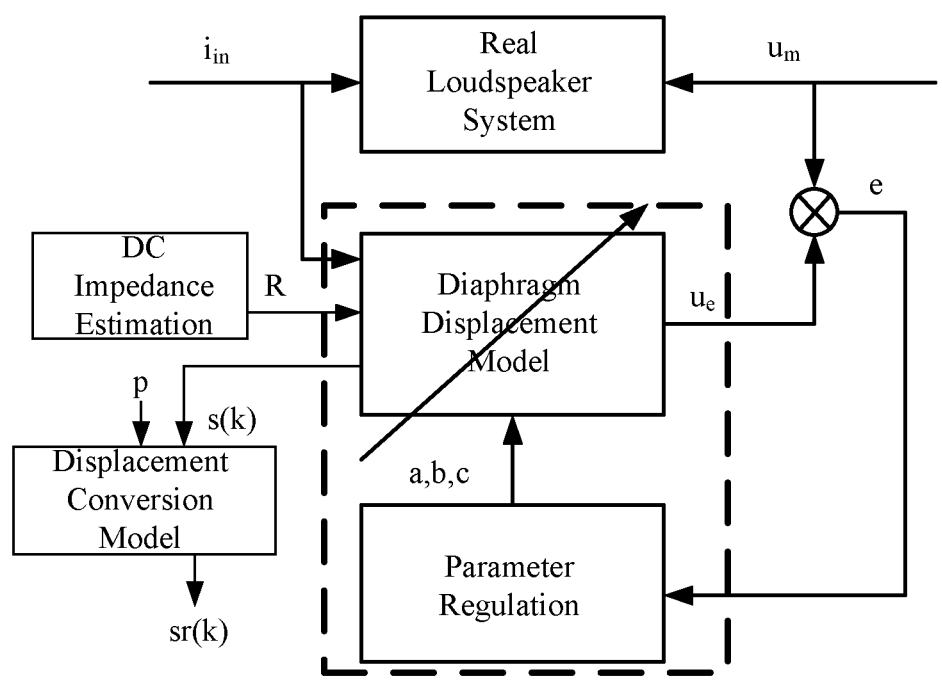
FIG. 2 is a schematic block diagram of an example data stream of a loudspeaker diaphragm state estimation method, in accordance with embodiments of the present invention.

Referring now to FIG. 1, which shows a flow diagram of an example loudspeaker diaphragm state estimation method, and also to FIG. 2, which shows a schematic block diagram of an example data stream of a loudspeaker diaphragm state estimation method, in accordance with embodiments of the present invention. At S100, a weight value of a diaphragm displacement model can be adjusted through an adaptive filtering method, until an error between an estimated value of a driving voltage and a measured value of the driving voltage of a loudspeaker is less than a predetermined threshold.

For example, the diaphragm displacement model can calculate or determine a diaphragm relative speed at a next moment based on an input current, a product value of a vector determined by an estimated value of a diaphragm relative speed, and an estimated value of a diaphragm relative displacement and a weight value vector obtained at a present moment. In addition, an estimated value of the driving voltage of the loudspeaker can be determined based on the estimated value of the diaphragm relative speed, the input current, and a DC impedance of the loudspeaker obtained at the present moment. In this way, in the diaphragm displacement model in accordance with embodiments of the present invention, the number of weight values is relatively small.

Figure 3:
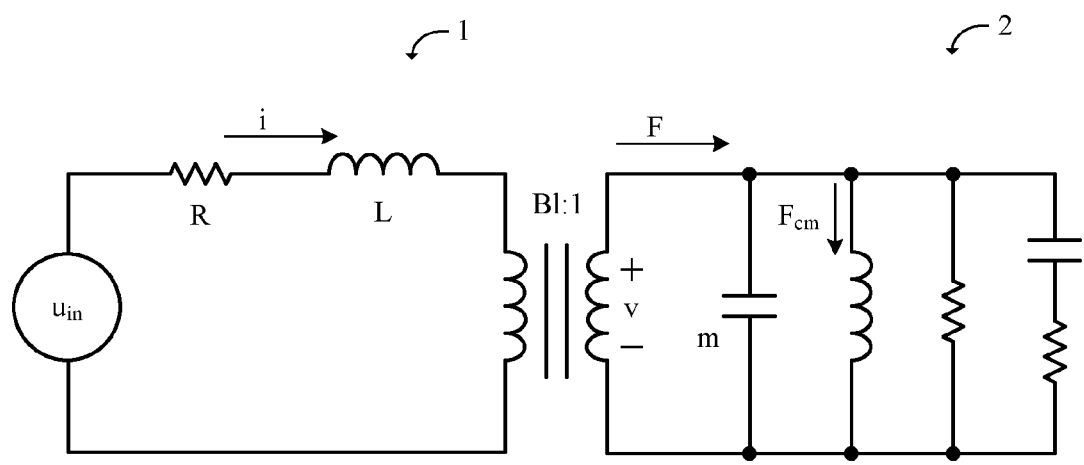
FIG. 3 is a diagram of an example electromagnetic and mechanical vibration model of a loudspeaker, in accordance with embodiments of the present invention.

Referring now to FIG. 3, shown is a diagram of an example electromagnetic and mechanical vibration model of a loudspeaker, in accordance with embodiments of the present invention. The diaphragm of the loudspeaker may vibrate and produce sound under the driving of an electromagnetic field that is generated by an electromagnetic coil. In FIG. 3, loop 1 is an equivalent circuit of a driving coil. Also, $u_{in}$ is a driving voltage (e.g., an input voltage of the driving coil or voice coil), R is a resistance of the driving coil (e.g., a DC impedance of the loudspeaker), L is an inductance of the driving coil, l is a total length of the driving coil, and B denotes the magnetic induction intensity in the gap between a magnet of the driving coil and a magnet of the diaphragm. When the driving coil is not energized, the magnet induction intensity in the magnetic pole gap between a permanent magnet of the driving coil and a permanent magnet of the diagram is a substantially constant value. Also in FIG. 3, i is a current in the loop 1 (e.g., a current flowing through the driving coil), and v is a coupling voltage at the driven side.

In FIG. 3, loop 2 is an equivalent model of a mechanical vibration system coupling with the driving coil. Here, different parameters in the mechanical mechanics system may be equivalent to one or more circuit components. The electromagnetic induction force F can be generated by induction voltage $u_{in}$, and may be equivalent to the current in loop 2. The quality of the mechanical vibration system, the force of the diaphragm, and the damping of the mechanical vibration system have different properties for the applied force, and these may be equivalent to the parallel capacitance, inductance, and resistance.

Thus, the relationship between input current i, driving voltage $u_{in}$, diaphragm speed v, and the diaphragm displacement s may satisfy the equations below:

$$\begin{cases} Ri + L\frac{di}{dt} + Blv = u_{in} \\ n\frac{dv}{dt} + R_m v + ks = Bli \\ \frac{ds}{dt} = v \end{cases}$$

Here, m is the diaphragm quality of the loudspeaker, $R_m$ is the mechanical damping of the loudspeaker, and k is an elastic coefficient of the diaphragm. If the model of the above formula is directly used to estimate the diaphragm displacement, due to the number of parameters utilized, the computation can be relatively complex. In addition, Bl may be a nonlinear parameter of relatively poor stability, and its usage in modeling an electric-mechanical system and a mechanical-sound system of the loudspeaker can result in further complexity.

Since the inductor can mainly respond to the high-frequency AC current and the effect on driving voltage $u_{in}$ can be neglected, the factor related to the inductor can be omitted in the model. Also, nonlinear parameter Bl can equal 1 through per-unit processing by neglecting its nonlinear characteristic. Accordingly, the corresponding displacement can be converted to a relative displacement parameter after the nonlinear portion of the model is neglected. Thus, the diaphragm displacement model of particular embodiments can be obtained as shown below:

$$\begin{cases} R \cdot i(k) + v(k) = u(k) \\ v(k+1) = a \cdot i(k) + (1-b) \cdot v(k) + c \cdot s(k) \end{cases}$$

Here, a, b and c are weight values of the model, and s(k) is the diaphragm relative displacement at the moment k. The model may be more stable when the coefficient of the diaphragm relative speed v(k) is 1−b. In the above formula, DC impedance R of the loudspeaker is a predetermined value, which can be obtained by any suitable approach, such as estimation. The DC impedance R in the model is a known value, and thus may not need to be obtained through an iteration of the model. In this way, only three weight values a, b, and c in the above formula may be need updating in order to estimate the diaphragm relative displacement s.

In certain embodiments, the input current, the loudspeaker diaphragm relative speed, and the relative displacement obtained by estimation can be configured as inputs, and the driving voltage of the loudspeaker can be configured as an output. Also, the three weight values of the displacement model can be adjusted through an adaptive filtering approach, until the error e between the estimated value of driving voltage $u_e$ and measured value $u_d$ of the driving voltage converge (e.g., to be less than a predetermined threshold). In this way, the diaphragm displacement model corresponding to the current weight value can accurately simulate the state of the loudspeaker. Further, the model may be adapted to subsequent diaphragm displacement estimation. Thus in particular embodiments, the state of the loudspeaker can be estimated while on line or in operation.

Figure 4:
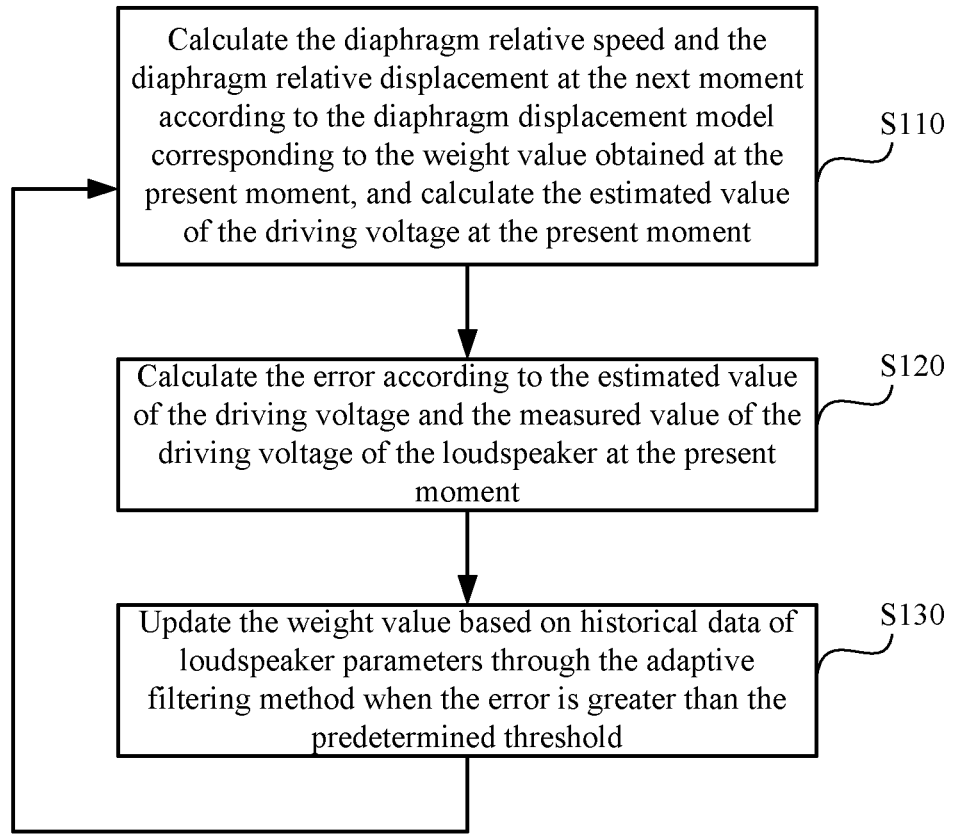
FIG. 4 is a flow diagram of an example method of adjusting a weight value, in accordance with embodiments of the present invention.

Referring now to FIG. 4, shown is a flow diagram of an example method of adjusting a weight value, in accordance with embodiments of the present invention. In this particular example, S100 of FIG. 1 can include, at S110, calculating diaphragm relative speed v(k+1) and diaphragm relative displacement s(k+1) at a next moment according to the diaphragm displacement model corresponding to weight values a(k), b(k) and c(k) at the present moment. For example, according to the above formulas, S110 can be executed according to the following formulas:

$$v(k+1)=a(k)*i(k)+(1-b(k))*v(k)+c(k)*s(k)$$

$$s(k+1)=ts*v(k)+s(k)$$

$$u(k)=v(k)+R*i(k)$$

Here, ts is a time length between two adjacent timings, u(k) is an estimated value of the driving voltage. At S120, the error can be calculated according to the estimated value of the driving voltage, and the measured value of the driving voltage of the loudspeaker at the present moment. For example, the error can be obtained by calculating the difference of the estimated value and the measured value of the driving voltage, as shown below:

$$e(k)=u\text{meas}(k)-u(k)$$

Here, e(k) is the error at the present moment, and umeas(k) is the measured value of the driving voltage. At S130, if the error is greater than the predetermined threshold, the weight value can be updated based on historical data of loudspeaker parameters through the adaptive filtering method.

For example, the weight values can be updated by using any suitable adaptive filtering algorithm for system identification. In one example, a least mean square (LMS) algorithm may be applied to update the weight values. The LMS algorithm can minimize the mean square value of the error between the output signal and the expected response of the filter. In the LMS algorithm, the weight vector may be defined as W(k)=[a(k), b(k), c(k)], and the iterative factors mua, mub and muc below can be selected to calculate the weight vector value for every time. For example, the weight vector can be updated with reference to the following formulas:

$$sa(k)=ts*va(k-1)+sa(k-1);$$

$$va(k)=(1-b(k))*va(k-1)+c(k)*sa(k-1)+i(k);$$

$$ua(k)=va(k);$$

$$a(k+1)=a(k)+mua*e(k)*ua(k);$$

$$sb(k)=ts*vb(k-1)+sb(k-1);$$

$$vb(k)=(1-b(k))*vb(k-1)+c(k)*sb(k-1)-vest(k-1);$$

$$ub(k)=vb(k);$$

$$b(k+1)=b(k)+mub*e(k)*ub(k);$$

$$sc(k)=ts*vc(k-1)+sc(k-1);$$

$$vc(k)=(1-b(k))*vc(k-1)+c(k)*sc(k-1)+sest(k-1);$$

$$uc(k)=vc(k);$$

$$c(k+1)=c(k)+muc*e(k)*uc(k)$$

In the above formulas, sa, sb and sc are the gradient vectors of the diaphragm displacement to the weight vectors a, b and c, respectively. In addition, ua, ub and uc are the gradient vectors of the voltage to the weight vectors a, b and c, respectively. Also, va, vb and vc are the gradient vectors of the diaphragm relative speed to the weight vectors a, b and c, respectively.

After the execution of S130 is completed, the process can return to S110 for iteration, until the error between the estimated value and the measured value of the driving voltage satisfied the predetermined threshold value. Those skilled in the art will recognize that other types of adaptive filtering algorithms can alternatively be employed in order to iterate and update the parameters of the model.

Referring back to FIG. 1, at S200, the diaphragm relative displacement of the loudspeaker can be estimated according to the diaphragm displacement model corresponding to the final determined weight values. The diaphragm displacement can be accurately estimated according to the determined diaphragm displacement model. In addition, since the parameters to be adjusted and updated are fewer as compared to other approaches, the construction process of the diaphragm displacement model may converge relatively quickly.

After the relative displacement is obtained, the corresponding control can be directly executed according to the relative displacement. In some cases, further estimation of the absolute displacement of the diaphragm may be needed based on the relative displacement. In such cases, at S300, a diaphragm absolute displacement can be obtained based on a predetermined relationship between the diaphragm relative displacement and the diaphragm absolute displacement, and the diaphragm relative displacement may be obtained by calculation.

As mentioned above, B1 of the model can be 1 through per-unit process, and the system identification parameters may be reduced, so s(k) of the model obtained through estimation may be the relative displacement, as opposed to the absolute displacement. Since the absolute displacement is related to the nonlinear parameter B1, it exhibits a strong nonlinear characteristic. In some cases, the diaphragm absolute displacement can be measured, and the diaphragm relative displacement can be estimated at the same time, and a corresponding relationship between them can be set up. At S300, on the basis of the such a relationship obtained in advance, the corresponding diaphragm absolute displacement can be obtained according to the diaphragm relative displacement. For example, corresponding relationship can be embodied as a corresponding relationship table, or a proportion function curve based on corresponding relationship.

In particular embodiments, methods as described herein may be suitable for application in loudspeaker driving circuits for estimating the loudspeaker diaphragm in real time, and can be adapted to or included within digital integrated circuits for processing, and/or as programs executed by a general processor, due to attendant advantages of fast convergence and high accuracy. In particular embodiments, an input current, a relative speed, and a relative displacement the loudspeaker diaphragm (e.g., obtained through estimation) can be received as inputs, and a driving voltage of the loudspeaker can be provided as an output.

A non-linear motor coupling coefficient can be set to be 1 through per-unit processing, and a more simplified loudspeaker diaphragm displacement model can be obtained. Also, the weight value of the diaphragm displacement model can be adjusted based on an adaptive filtering method, until the error between the estimated value of the driving voltage and the measured value of the driving voltage is less than a predetermined threshold. Further, the relative displacement of the diaphragm can be determined according to the finally determined weight value, in order to quickly and accurately estimate the loudspeaker diaphragm displacement, and realize accurate control of the loudspeaker.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A loudspeaker diaphragm state estimation method, the method comprising:
   a) adjusting a weight value of a diaphragm displacement model by adaptive filtering until an error between an estimated value of a driving voltage of a loudspeaker and a measured value of said driving voltage is less than a predetermined threshold;
   b) estimating a diaphragm relative displacement of said loudspeaker according to said diaphragm displacement model that corresponds to a final determined weight value;
   c) determining a diaphragm relative speed at a next moment based on an input current, a product value of a vector determined by an estimated value of a diaphragm relative speed and an estimated value of a diaphragm relative displacement, and a weight value vector obtained at a present moment; and
   d) determining an estimated value of said driving voltage based on said estimated value of said diaphragm relative speed, said input current, and a DC impedance of said loudspeaker obtained at said present moment.

2. The method of claim 1, wherein adjusting said weight value of said diaphragm displacement model through said adaptive filtering comprises:
   a) determining said diaphragm relative speed and said diaphragm relative displacement at said next moment according to said diaphragm displacement model that corresponds to said weight value obtained at said present moment;
   b) determining said estimated value of said driving voltage at said present moment;

c) determining said error according to said estimated value of said driving voltage and said measured value of said driving voltage of said loudspeaker at said present moment; and d) updating said weight value based on historical data of loudspeaker parameters through said adaptive filtering when said error is larger than said predetermined threshold.

3. The method of claim 1, wherein said diaphragm displacement model is:

$$\begin{cases} R \cdot i(k) + v(k) = u(k) \\ v(k+1) = a \cdot i(k) + (1-b) \cdot v(k) + c \cdot s(k) \end{cases}$$

wherein R is said DC impedance of said loudspeaker, i(k) is said input current at moment k, v(k) is said diaphragm speed at moment k, u(k) is said estimated value of said driving voltage at moment k, s(k) is said diaphragm relative displacement, and a, b and c are weight values corresponding to i(k), v(k) and s(k).

4. The method of claim 2, wherein said adaptive filtering is a least mean square algorithm (LMS).

5. The method of claim 4, wherein said DC impedance of said loudspeaker is obtained by estimation.

6. The method of claim 1, further comprising determining a diaphragm absolute displacement based on a predetermined relationship between said diaphragm relative displacement and said diaphragm absolute displacement, wherein said diaphragm relative displacement is obtained by calculation.

7. The method of claim 6, wherein said predetermined relationship of said diaphragm relative displacement and said diaphragm absolute displacement is a proportion factor that is measured in advance.

8. A loudspeaker driving circuit, comprising a processor configured to perform the method of claim 1.

* * * * *